US011237235B2

United States Patent
Harris et al.

(10) Patent No.: US 11,237,235 B2
(45) Date of Patent: Feb. 1, 2022

(54) SHIMMING COILS FOR MAGNETIC RESONANCE IMAGING

(71) Applicant: SYNAPTIVE MEDICAL INC., Toronto (CA)

(72) Inventors: Chad Tyler Harris, Toronto (CA); Philip J. Beatty, Toronto (CA); Alexander Gyles Panther, Toronto (CA); Jeff Alan Stainsby, Toronto (CA); David Mark Deschenes, Toronto (CA)

(73) Assignee: SYNAPTIVE MEDICAL INC., Toronto (CA)

( * ) Notice: Subject to any disclaimer, the term of this patent is extended or adjusted under 35 U.S.C. 154(b) by 0 days.

(21) Appl. No.: 16/773,532

(22) Filed: Jan. 27, 2020

(65) Prior Publication Data
US 2020/0400765 A1   Dec. 24, 2020

Related U.S. Application Data

(63) Continuation of application No. 15/546,393, filed as application No. PCT/IB2015/052628 on Apr. 10, 2015, now Pat. No. 10,551,454.

(51) Int. Cl.
*G01V 3/00* (2006.01)
*G01R 33/3875* (2006.01)
(Continued)

(52) U.S. Cl.
CPC ....... *G01R 33/3875* (2013.01); *G01R 33/385* (2013.01); *G01R 33/543* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS 5,760,582 A    6/1998  Morrone
6,023,167 A    2/2000  Morich
(Continued)

FOREIGN PATENT DOCUMENTS

CN    1934458      3/2007
CN    101290344    10/2008
(Continued)

OTHER PUBLICATIONS

Chinese search report issued in relation to corresponding CN Application No. 2015800786924 dated Jul. 24, 2019, dated Aug. 2, 2019, 3 pags.
(Continued)

*Primary Examiner* — Walter L Lindsay, Jr.
*Assistant Examiner* — Frederick Wenderoth

(57) ABSTRACT

A method for operating a magnetic resonance imaging (MRI) system that includes: accessing data indicating a first region for imaging a portion of a subject, the portion being placed in a main magnet of the MRI system and the main magnet generating a magnetic field; selecting, from a group of available shimming coils, a first subset of shimming coils arranged and configured such that, when the shimming coils in the first subset are driven, a homogeneity of the magnetic field at the first region is increased; and driving the shimming coils in the selected first subset of shimming coils without driving other shimming coils in the group of available shimming coils such that the homogeneity of the magnetic field at the first region increases relative to the homogeneity of the magnetic field at the first region when the shimming coils of the selected first subset are not driven.

18 Claims, 8 Drawing Sheets

(51) Int. Cl.
  *G01R 33/385* (2006.01)
  *G01R 33/54* (2006.01)
(58) Field of Classification Search
  USPC .......................................................... 324/309
  See application file for complete search history.

(56) References Cited

U.S. PATENT DOCUMENTS

| | | | |
|---|---|---|---|
| 6,507,190 | B1 | 1/2003 | Hinks |
| 80,164,878 | | 7/2008 | Morich |
| 7,592,812 | B2 | 9/2009 | Ikedo |
| 2002/0135371 | A1* | 9/2002 | Renz ................. G01R 33/3873 324/318 |
| 2005/0154291 | A1 | 7/2005 | Zhao |
| 2006/0113995 | A1 | 6/2006 | Jarvis |
| 2008/0084262 | A1 | 4/2008 | Beasley |
| 2008/0164878 | A1 | 7/2008 | Morich et al. |
| 2011/0163749 | A1 | 7/2011 | Katscher et al. |
| 2012/0092014 | A1 | 4/2012 | Castillo |
| 2012/0274326 | A1 | 11/2012 | Lee et al. |
| 2013/0127468 | A1 | 5/2013 | Biber et al. |
| 2013/0147476 | A1 | 6/2013 | Shvartsman |
| 2013/0193968 | A1 | 8/2013 | Biber et al. |
| 2014/0225613 | A1 | 8/2014 | Reykowski |
| 2014/0327440 | A1 | 11/2014 | Nakanishi et al. |
| 2014/0333306 | A1 | 11/2014 | Ham |
| 2016/0274205 | A1* | 9/2016 | Stemmer ............ G01R 33/543 |
| 2018/0024212 | A1 | 1/2018 | Harris et al. |

FOREIGN PATENT DOCUMENTS

| | | |
|---|---|---|
| CN | 101995560 | 3/2011 |
| CN | 102830377 | 12/2012 |
| CN | 102914751 | 2/2013 |
| EP | 1956382 | 8/2008 |
| JP | 11342121 | 12/1999 |
| JP | 2011229632 | 11/2011 |
| JP | 2013031664 | 2/2013 |
| JP | WO 2013105384 | 7/2013 |

OTHER PUBLICATIONS

International Preliminary Report on Patentability Chapter II dated May 5, 2017 in corresponding International Patent Application No. PCT/IB2015/052628.
International Search Report and Written Opinion dated Jul. 22, 2015 in corresponding International Patent Application No. PCT/IB2015/052628.
Japanese Office Action in Japanese Appln. No. 2017552976, dated Aug. 2, 2019, 4 pages (with English Translation).
Japanese Office Action in Japanese Appln. No. 2017-552976, dated Dec. 12, 2018, 5 pages.
Japanese Search Report in Japanese Appln. No. 2017552976, dated Nov. 22, 2018, 10 pages (with English Translation).
Office Action issued by National Intellectual Property Administration, PRC in relation to corresponding Chinese Patent Application No. 2015800786924 dated Aug. 2, 2019, 3 pages (with English-language translation).
PCT International Search Report and Written Opinion in PCT/IB2015/052628 dated Jul. 22, 2015, 16 pages.

* cited by examiner

16 Channel RF/Shim coil array (side view)

Region of interest (grey area), active coils (bold black), inactive coils (black).

SHIMMING COILS FOR MAGNETIC RESONANCE IMAGING

CROSS-REFERENCE TO RELATED APPLICATIONS

This application is a continuation of U.S. application Ser. No. 15/546,393, filed on Jul. 26, 2017, which is a National Stage Application under 35 U.S.C. § 371 and claims the benefit of International Application No. PCT/IB2015/052628, filed on Apr. 10, 2015. The disclosure of the prior applications are considered part of and are incorporated by reference in the disclosure of this application.

BACKGROUND

The present disclosure relates to magnetic resonance imaging.

SUMMARY

In one aspect, some implementations provide a method for operating a magnetic resonance imaging (MRI) system, the method including: accessing data indicating a first region for imaging at least a portion of a subject, the portion being placed in a main magnet of the MRI system and the main magnet generating a substantially uniform magnetic field; based on the accessed data, selecting, by a control unit associated with the MRI system and from a group of available shimming coils, a first subset of shimming coils that are arranged and configured such that, when the shimming coils in the first subset are driven, a homogeneity of the magnetic field at the first region is increased; and driving the shimming coils in the selected first subset of shimming coils without driving other shimming coils in the group of available shimming coils such that the homogeneity of the magnetic field at the first region increases relative to the homogeneity of the magnetic field at the first region when the shimming coils of the selected first subset are not driven.

Implementations may include one or more of the following features. The method may further include: determining, by the control unit, respective weights to be applied to the shimming coils in the selected first set of shimming coils. Driving the shimming coils in the selected first subset of shimming coils may further include: generating an electrical current for each of the shimming coils in the selected first subset of shimming coils, wherein the electrical current for each shimming coil in the selected first subset is proportional to the respective weight for the shimming coil; and distributing the generated electrical currents to the shimming coils in the selected first subset.

Driving the shimming coils in the selected first subset of shimming coils may include simultaneously driving the shimming coils in the selected first subset of shimming coils. Driving the shimming coils in the selected first subset of shimming coils may include: connecting a group of power amplifiers to the selected first subset of shimming coils, wherein the number of power amplifiers in the group is less than the number of shimming coils in the group of available shimming coils. Connecting the group of power amplifiers may include: connecting the group of power amplifiers to the selected first subset of shimming coils such that each power amplifier in the group of power amplifiers is connected to a respective one of the shimming coils in the selected first subset of shimming coils. Connecting the group of power amplifiers may include connecting the group of power amplifiers to the selected first subset of shimming coils such that each power amplifier in the group of power amplifiers is connected to more than one respective shimming coil.

The method may further include accessing data indicating a second region for imaging another portion of the subject, the second region being different from the first region; based on the accessed data indicating the second region, selecting, by a control unit associated with the MRI system and from a group of available shimming coils, a second subset of shimming coils that are arranged and configured such that, when the shimming coils in the second subset are driven, a homogeneity of the magnetic field at the second region of interest is increased, the selected second subset differing from the selected first subset by at least one shimming coil; and driving the shimming coils in the selected second subset of shimming coils without driving other shimming coils in the group of available shimming coils such that the homogeneity of the magnetic field at the second region increases relative to the homogeneity of the magnetic field at the second region when the shimming coils of the selected second subset are not driven.

Driving the selected first subset of shimming coils may include connecting a group of power amplifiers to the selected first subset of shimming coils, wherein the number of power amplifiers in the group is less than the number of shimming coils in the group of available shimming coils; and driving the shimming coils of the second subset of shimming coils may include: disconnecting the group of power amplifiers from the selected first subset of shimming coils; and after disconnecting the group of power amplifiers from the selected first subset of shimming coils, connecting the group of power amplifiers to the selected second subset of shimming coils.

In another aspect, some implementations provide a magnetic resonance imaging (MRI) system, including: a housing having a bore in which a subject to be imaged is placed; a main magnet accommodated by said housing and configured to generate a substantially uniform magnet field within the bore; a group of available shimming coils placed around said housing and configured to increase a homogeneity of the magnetic field; pulse generating coils to generate and apply radio frequency (RF) pulses in sequence to scan the subject; gradient coils to provide perturbations to the substantially uniform magnet field that encode MRI signals acquired in response to the applied RF pulses; a control unit coupled to the main magnet and configured to: access data indicating a first region for imaging at least a portion of a subject; based on the accessed information, select, from the group of available shimming coils, a first subset of shimming coils that are arranged and configured such that, when the shimming coils in the first subset are driven, a homogeneity of the magnetic field at the first region is increased; and cause the shimming coils in the selected first subset of shimming coils to be driven without other shimming coils in the group of available shimming coils being driven such that the homogeneity of the magnetic field at the first region increases relative to the homogeneity of the magnetic field at the first region when the shimming coils of the selected first subset are not driven.

Implementations may include one or more of the following features. The control unit may be further configured to: determine respective weights to be applied to the shimming coils in the selected first subset of shimming coils. The MRI system may further include: a group of power amplifiers, wherein the number of power amplifiers is less than the number of shimming coils in the group of available shimming coils. Each power amplifier may be configured to:

generate an electrical current for each of the shimming coils in the selected first subset of shimming coils in accordance with the determined respective weight. Each power amplifier may be connected to a respective shimming coil. Each power amplifier may be connected to more than one shimming coils. Each shimming coil may be configured to: apply a field correction to the magnetic field in accordance with a particular order basis function. The particular order basis function may be a spherical harmonic function. The selected first subset of shimming coils may correspond to a group of basis functions and wherein more than one order basis functions may be blended according to the respective determined weights.

The control unit may be further configured to: access data indicating a second region for imaging a portion of the subject placed in the bore; based on the accessed data indicating the second region, selecting, from a group of available shimming coils, a second subset of shimming coils that are arranged and configured such that, when the shimming coils in the selected second subset are driven, a homogeneity of the magnetic field at the second region is increased, the selected second subset differing from the first subset by at least one shimming coil; and cause each shimming coil of the selected second subset of shimming coils to be driven without other shimming coils in the group of available shimming coils being driven such that the homogeneity of the magnetic field at the second region increases relative to the homogeneity of the magnetic field at the second region when the shimming coils of the selected second subset are not driven.

The control unit may be further configured to: cause the shimming coils in the selected first subset of shimming coils to be driven comprises: causing a group of power amplifiers to be connected to the selected first subset of shimming coils; and cause the shimming coils in the selected second subset of shimming coils to be driven comprises: causing the group of power amplifiers to be disconnected from the selected first subset of power amplifiers; and after the group of power amplifiers are disconnected from the shimming coils of the selected first subset, causing the group of power amplifiers to be connected to the selected second subset of shimming coils. The details of one or more aspects of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Embodiments will now be described, by way of example only, with reference to the drawings, in which.

Like reference symbols in the various drawings indicate like elements.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

According to selected embodiments of the present disclosure, magnetic resonance imaging systems and devices are provided in which an array of shimming coils are arranged, for example, within the sidewalls of a solenoid magnet. In some instances, a subset of the available shimming coils are selected so that a group of power amplifiers specifically drive the selected subset of shimming coils to effectuate an improvement in field homogeneity in a particular region of interest. In later instances, a different subset of the available shimming coils are selected. Yet the same group of power amplifiers drive this different subset of shimming coils to increase field homogeneity within a different region of interest. While driving a particular subset of shimming coils, contributions from each power amplifier may be weighted different to achieve a desired field homogeneity improvement. The weighting varies, depending on, for example, the size of the subset of shimming coils chosen and the particular region of interest chosen.

By dynamically connecting one group of power amplifiers to shimming coils selected on demand, the shimming effect can be tailored specifically to increase field homogeneity within a particular region of interest. The approach can generate marked improvement of using all available shimming coils to increase field homogeneity within the particular field of interest. By reusing the same power amplifiers for different subsets of shimming coils, the approach may lead to a reduction in the number of power amplifiers being used for shimming purposes and hence reduced hardware cost.

Figure 1A:
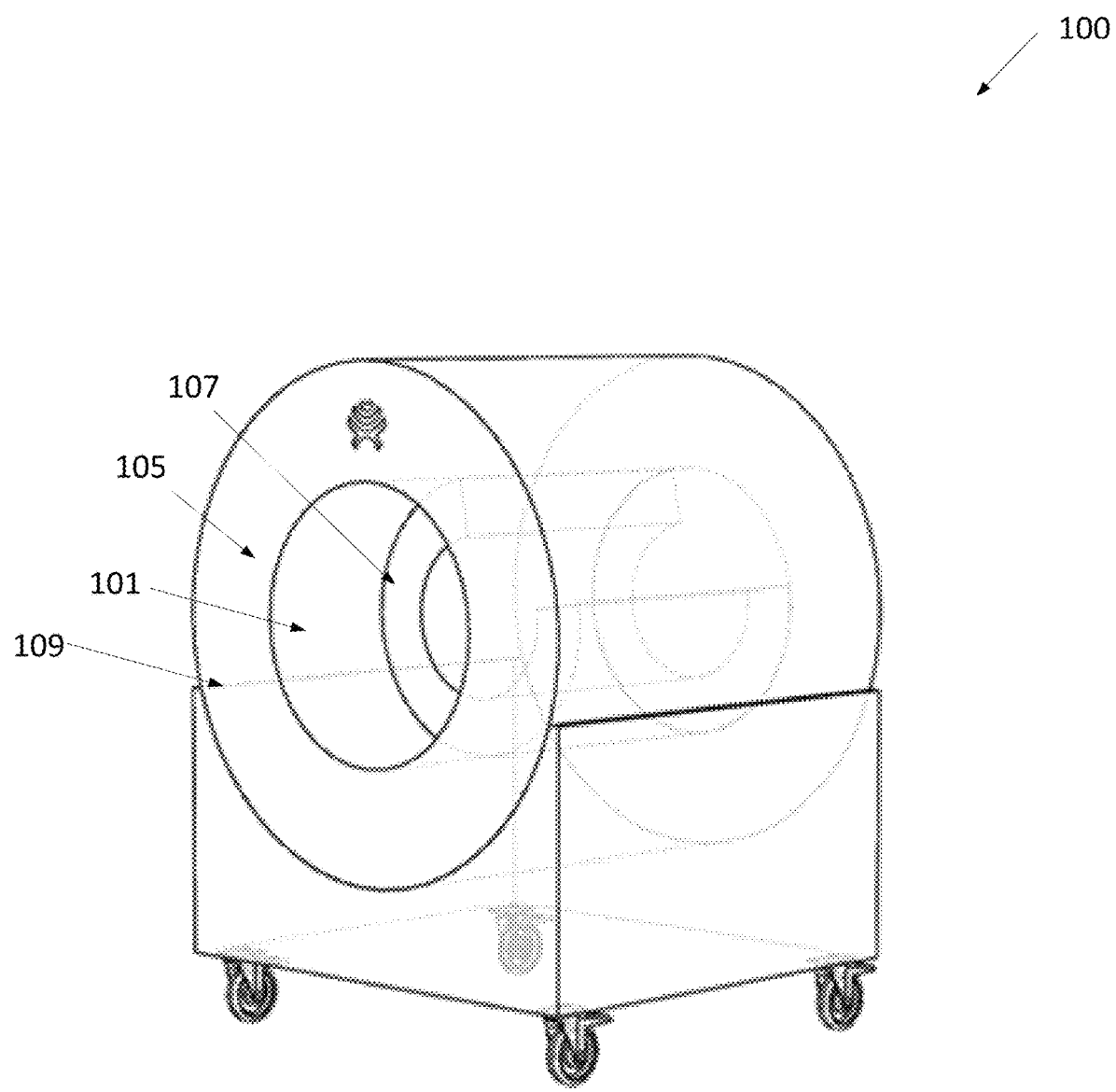
FIGS. 1A-1B show an example of a magnetic resonance imaging (MRI) system with a solenoid magnet where shim coils are provided.
Figure 1B:
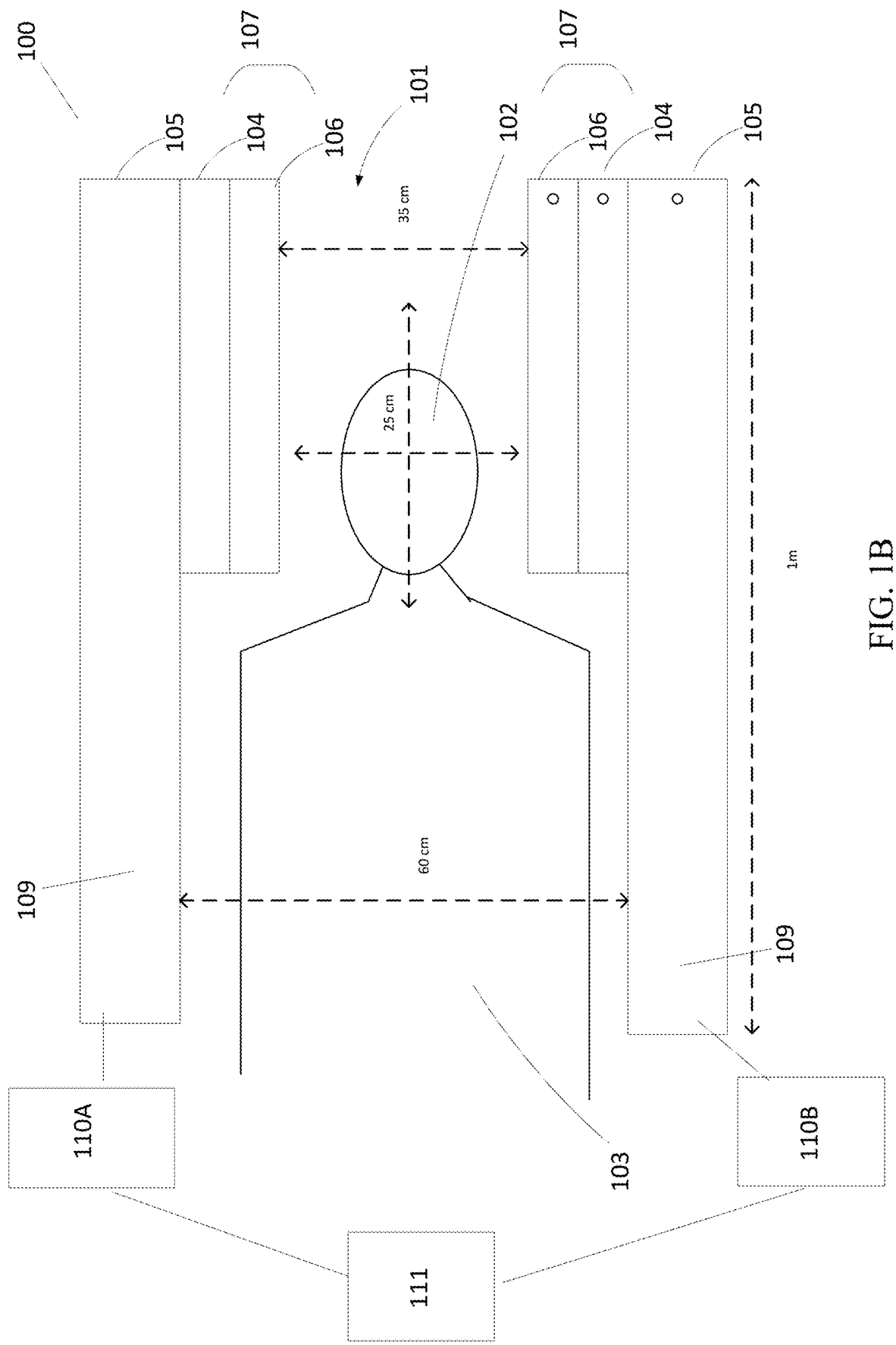

FIGS. 1A-1B show a perspective view and a cross-sectional view of an example of a magnetic resonance imaging (MRI) system 100 in which a solenoid magnet 105 is provided in a cylindrical shape with an inner bore 101. Coil assembly 107, including transmit coil 106 and gradient coil 104, is provided within solenoid magnet 105. Coil assembly 107 may generally be shaped as an annular structure and housed within the inner bore of solenoid magnet 105. In some implementations, annular coil assembly 107 only includes gradient coil 104. In these implementations, annular coil assembly does not include transmit coil 106 or any receiver coil. For these implementations, radio-frequency (RF) signals are, for example, transmitted by local coils for imaging the head region 102 of patient 103. In one instance, a head coil in a birdcage configuration is used for both transmitting and receiving RF signals for imaging the subject. In another instance, a surface coil is used for transmitting an RF signal into the subject and a phased array coil configuration is used for receiving MR signals in response. The embodiments provided herein may be adapted for intraoperative MRI, and MRI systems for use in an emergency room setting.

In some implementations, shimming coils 109 are housed within the cylindrical walls of solenoid magnet 105. Shimming coils 109 are powered by a group of power amplifiers. For example, power amplifiers 110A and 110B, housed in a control room may be connected to shimming coils 109 to provide shimming of the magnetic field within inner bore 101. In driving shimming coils 109, power amplifiers 110A and 110B may be controlled by control unit 111. Control unit 111 generally includes one or more processors as well as programming logic to configure the power amplifier 110A and 110B. In some instances, control unit 111 is housed in a control room separate from the solenoid magnet 105 of the MRI system 100. In these implementations, an array of shimming coils can be used to provide adjustment to the field strength within the inner bore 101 such that the magnet field within the inner bore 101 becomes more homogenous, as explained in more detail below.

Figure 2A:
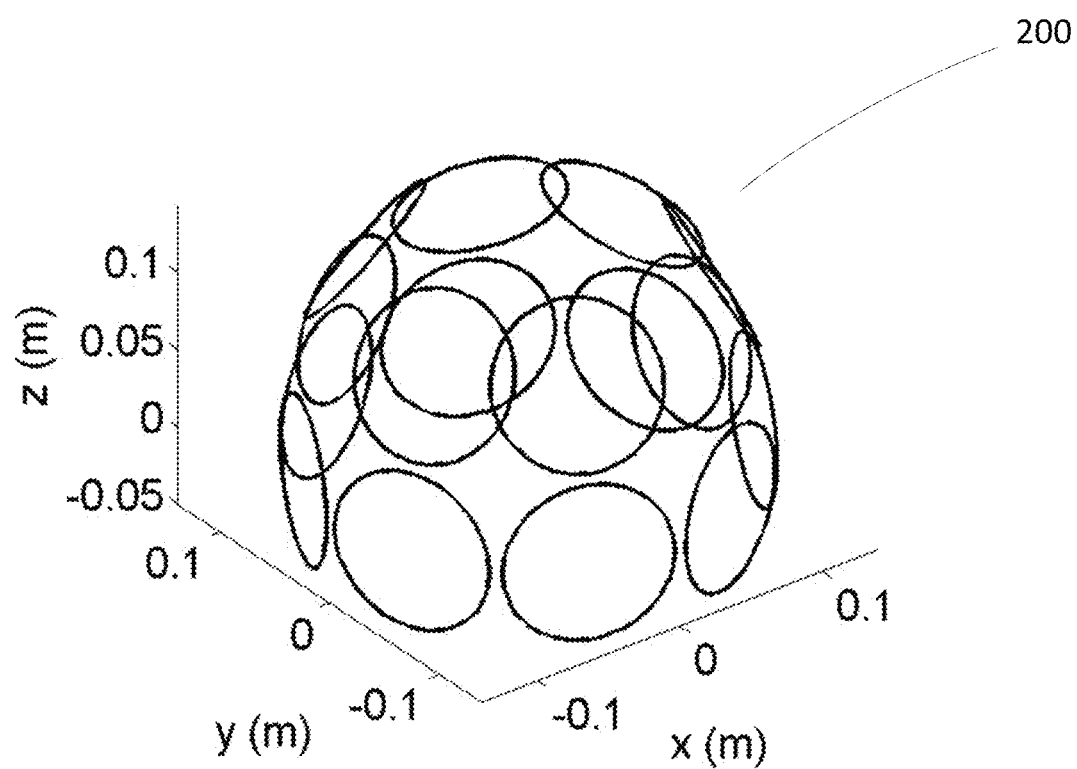
FIG. 2A illustrates a 3D view of an example of a 16-channel shimming coil array.
Figure 2B:
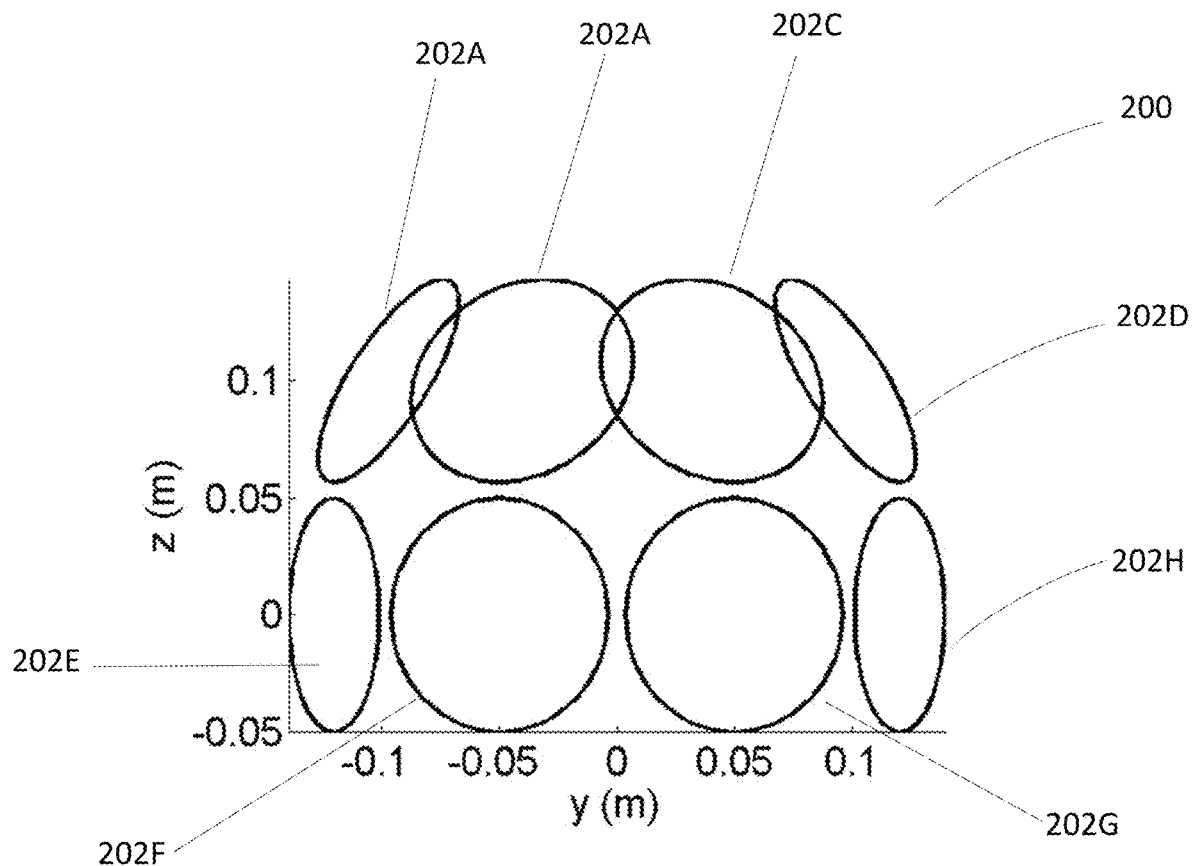
FIG. 2B illustrates a side view of the example of the 16-channel shimming coil array.

FIG. 2A illustrates a 3D view of an example of a 16-channel shimming coil array 200. In this configuration, the 16 shimming coils are distributed on a spherical surface at locations chosen to effectuate homogeneity improvement in all three spatial dimensions. FIG. 2B illustrates a side view of the 16-channel shimming coil array 200. This side view reveals only 8 of the 16 shimming coils located on the viewing side. Namely, these eight coils are annotated as coils 202A to 202H. Each shimming coil can be driven by a power amplifier with a particular current. Generally, each shimming coil may provide shimming for field adjustment as defined by a particular order of a spatial harmonic function, for example, the spherical harmonics. By virtue of spatial symmetries in the spatial harmonics functions, in some instances, to shim a particular region encompassed by the sphere, some shimming coils from the 16 shimming coils can be driven with the same current.

Figure 2C:
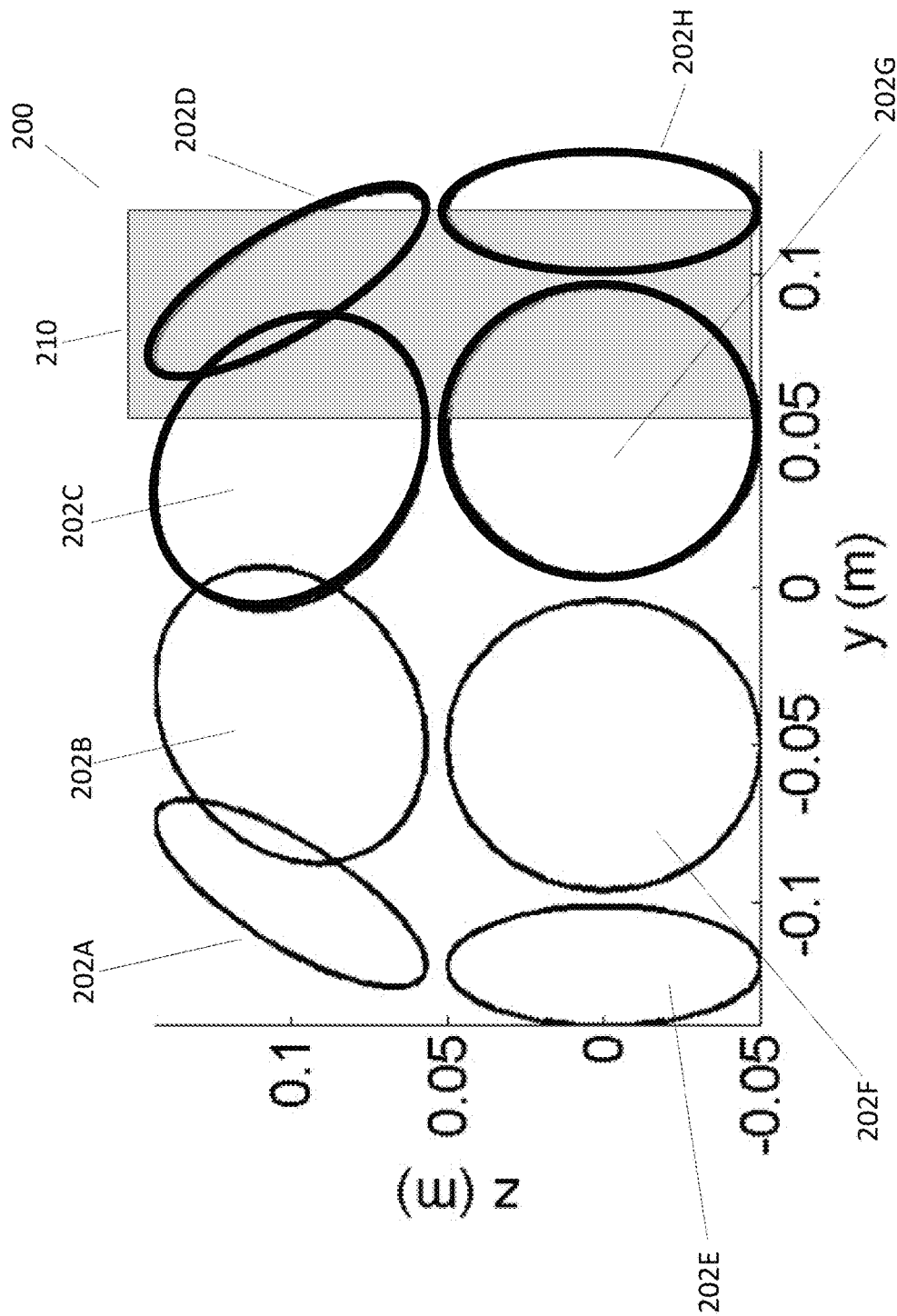
FIG. 2C illustrates an example of using a subset of the 16-channel shimming coil array.

FIG. 2C illustrates an example of using a subset of the 16-channel shimming coil array 200 to focus on active shimming of a particular region of interest 210. Here, the region of interest 210 is within a gray area as illustrated. To shim the magnetic field within this region 210, a subset of the 16-channel shimming coil array 200, namely, shimming coils 202C, 202D, 202G, and 202H may be employed, for example, as highlighted in bold in FIG. 2C. In other words, shimming coils 202C, 202D, 202G, and 202H are dynamically connected to power amplifiers upon selection. This selection of the subset of shimming coils leaves the unselected shimming coils, namely, coils 202A, 202B, 202E, and 202F, as inactive coils. Coils 202A, 202B, 202E, and 202F are not connected to power amplifiers during shimming when they are not selected. This selection approach allows the shimming protocol to focus on using a subset of shimming coils. In some instances, the subset of shimming coils can be selected based on their proximity to the region of interest in which the magnetic field is to be shimmed. In other instances, the subset of shimming coils can be selected according to the corresponding spatial harmonic functions they can generate for shimming the magnetic field at the desired region of interest. For example, the four most significant orders of spatial harmonics may be chosen to effectuate shimming, and these four spatial harmonics can correspond to four particular shimming coils. By combining the four spatial harmonics with corresponding weights, shimming contributions from the four spatial harmonics can be blended. The corresponding weights for the spatial harmonics can be determined such that the combination yields the desired shimming effects at the ROI. Notably, a spherical arrangement of shimming coils is one implementation. In other implementations, shimming coils can be shaped and arranged on a cylindrical surface, for example, a surface of the cylindrical structure of solenoid magnet 105. Such arrangement may be known as a cylindrical configuration. While the above illustration provides an example of using shimming coils 202C, 202D, 202G, and 202H to increase field homogeneity within region 210, a different subset of shimming coils may be used to increase field homogeneity within a different region of interest. More details of the shimming procedure are discussed below.

Figure 3A:
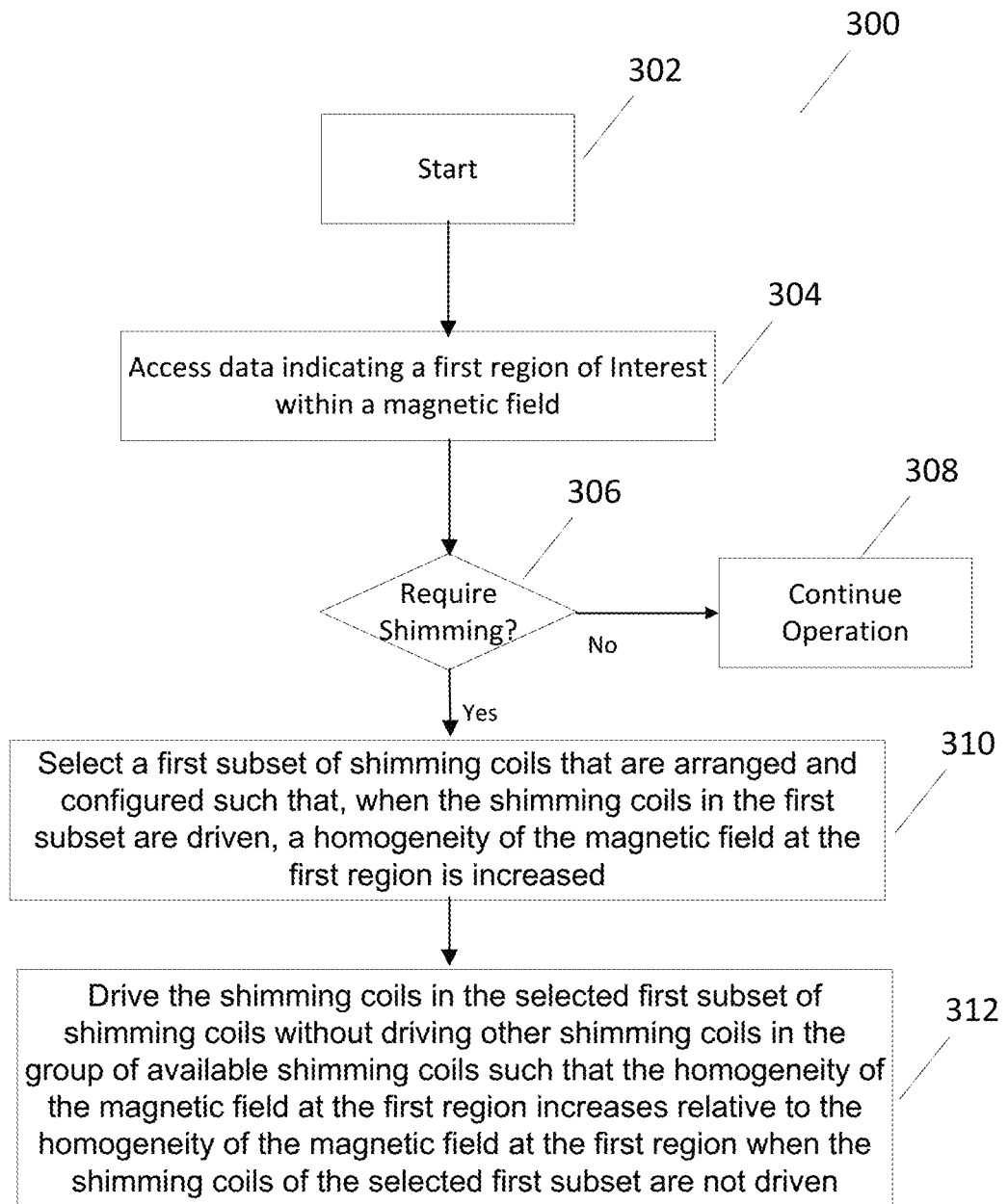
FIGS. 3A-3C show various aspects of an example of a process for operating shimming coils.
Figure 3B:
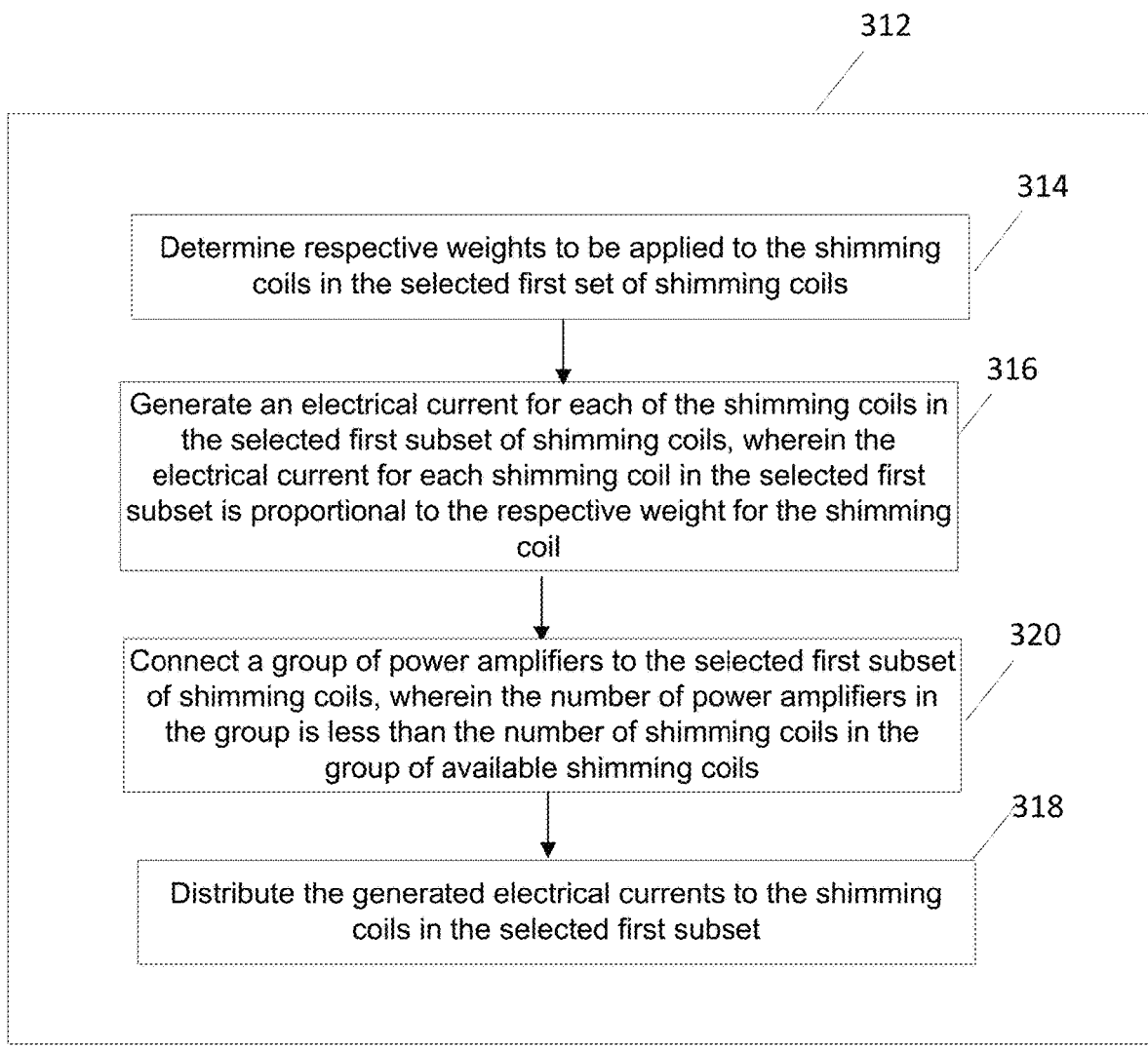
Figure 3C:
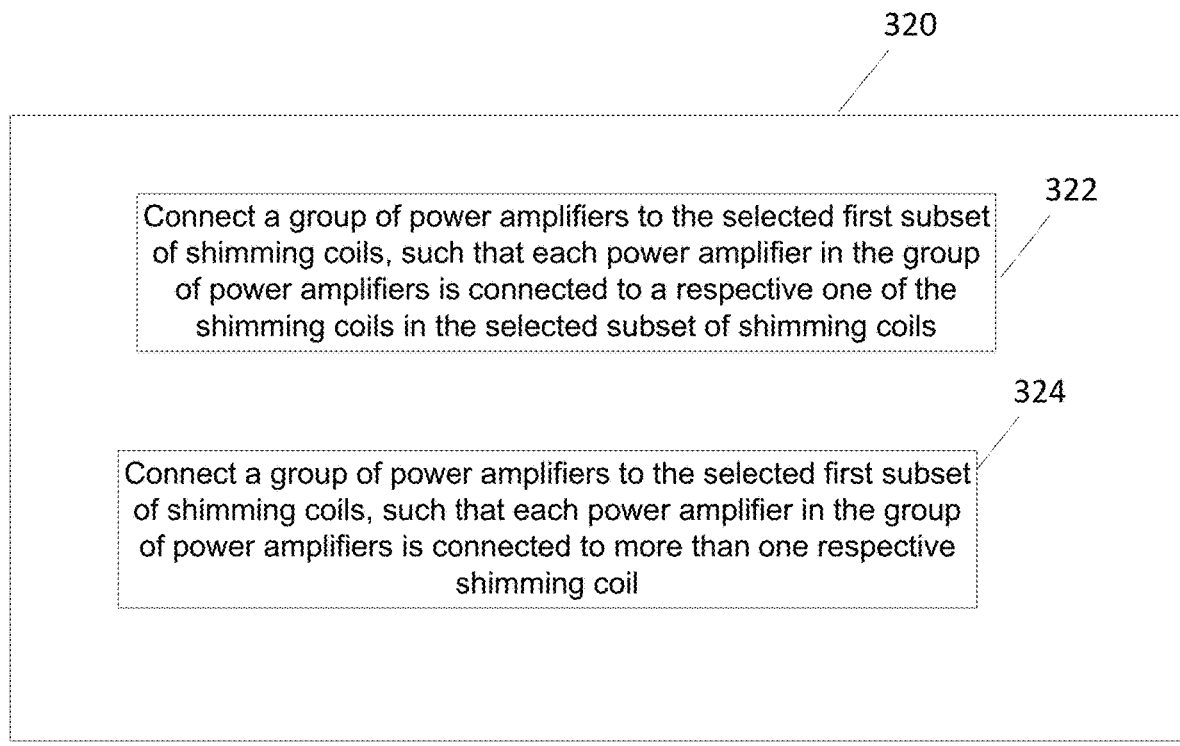

FIG. 3A-3C show aspects of an example of a flow chart 300 for operating the shimming coils of MRI system 100. When the process flow initiates (302), data indicating a region of interest (ROI) within a magnetic field may be accessed (304). In one instance, data indicating a region of interest can be, for example, stored in data memory of a control unit 111 associated with the MRI system 100 and the stored data may be accessed during the shimming session. The coordinates of a region of interest can also be determined based on an operator selecting a particular region of interest, for example, based on a scout scan of head 102 of patient in the inner bore 101. The selected region of interest can be translated into physical coordinate within the inner bore 101 by a control unit 111 of MRI system 100.

Next, the control unit 111 determines whether shimming is required (306). In some instances, the determination may be made based on an input from an operator of MRI system 100. Other instances may incorporate an auto shimming aspect. To quantify a baseline quality of field homogeneity, some implementations may measure, for example, the spectral width of the free induction decay (FID) from the region of interest. If the spectral width of the FID signal is satisfactorily narrow for the desired imaging application, the imaging protocol may continue without shimming (308). Otherwise, shimming may be performed, as discussed in more detail below.

When shimming is required, the controller 111 selects, based on the accessed data a first subset of shimming coils from the group of available shimming coils. The first subset of shimming coils are arranged and configured such that, when the shimming coils in the first subset are driven, a homogeneity of the magnetic field at the first region is increased. For instance, in the above example of an operator selecting a region of interest, based on the selected region of interest, physical coordinates within the inner bore 101 that correspond to the selected ROI can be determined by a control unit 111 of MRI system 100. The physical coordinates allow the control unit to select the first subset of shimming coils from the available shimming coils for performing shimming of the magnetic field within the selected ROI (310). As noted above, the selected shimming coils, may then be driven by power amplifiers (without driving the other shimming coils) to generate a correction field such that field homogeneity within the selected ROI increases relative to the homogeneity within the selected ROI when the selected shimming coils are not driven (312).

In some implementations, the specific weight to be applied at shimming coils in the selected subset of shimming coils can be determined (314). In these implementations, electrical current can then be generated by power amplifiers for each of the shimming coils in the selected subset of shimming coils (316). The generated electrical currents are proportional to the weights determined for each shimming coil. Thereafter, the power amplifiers may distribute the generated electrical currents to each shimming coil (318).

In some implementations, driving each shimming coil in the selected subset of shimming coils include dynamically connecting a group of power amplifiers to the selected subset of shimming coils (320). In some configurations, each power amplifier in the group of power amplifiers is connected to a respective one of the shimming coils in the selected subset of shimming coils (322). In other configurations, each power amplifier in the group of power amplifiers is connected to more than one respective shimming coil (324). In these configurations, the number of power amplifiers may be less than the number of available shimming coils. Thus, a subset of available shimming coils may be dynamically connected on demand for a particular shimming session. During the particular shimming session, the subset of shimming coils dynamically connected to the power amplifiers may be driven simultaneously. Driving the shimming coils in the subset of shimming coils without driving other shimming coils in the group of available shimming coils but not in the subset renders the magnetic field at the region of interest more homogenous.

In some implementations, data indicating a new and different region of interest may accessed, leading to a new shimming session for the magnetic field within corresponding physical coordinates inside the inner bore 101. For example, data indicating the new region of interest can be, for example, in data memory of a control unit 111 associated with the MRI system 100 and then accessed during the new shimming session. The coordinate of new region of interest can be determined based on an operator selecting the new region of interest. The newly selected region of interest can be translated into physical coordinate within the inner bore 101 by a control unit 111 of MRI system 100. The new shimming session can be performed using a new and different subset of shimming coils while using the same power amplifiers. The new subset of shimming coils may be better tailored to effectuate shimming in the new region of interest than the earlier subset. In more detail, driving the shimming coils in the new subset includes disconnecting the group of power amplifiers from the earlier subset of shimming coils, and thereafter connecting the same group of power amplifiers to shimming coils in the new subset. By re-using the same power amplifiers, hardware power amplifiers can be leveraged for various shimming coils tailored for specific regions of interest.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method for operating a magnetic resonance imaging (MM) system, the method comprising:
   accessing data indicating a first region for imaging at least a portion of a subject, the portion being placed in a main magnet of the MM system and the main magnet generating a substantially uniform magnetic field;
   based on the accessed data, dynamically selecting, by a control unit associated with the MRI system and from a group of available shimming coils, a first subset of shimming coils for increasing a homogeneity of the magnetic field at the first region; and
   driving, using a fixed group of amplifiers, the shimming coils in the selected first subset of shimming coils without driving other shimming coils in the group of available shimming coils such that the homogeneity of the magnetic field at the first region increases relative to the homogeneity of the magnetic field at the first region when the shimming coils of the selected first subset are not driven by the fixed group of amplifiers,
   wherein a number of power amplifiers in the fixed group of amplifiers is smaller than a number of shimming coils in the available shimming coils, and
   wherein the fixed group amplifier is used even when a different subset of shimming coils are dynamically selected for increasing the homogeneity of the magnetic field at the first region.

2. The method of claim 1, further comprising:
   determining, by the control unit, respective weights to be applied to the shimming coils in the first subset of shimming coils.

3. The method of claim 2, wherein driving the shimming coils in the first subset of shimming coils comprises:
   generating an electrical current for each of the shimming coils in the first subset of shimming coils, wherein the electrical current for each shimming coil in the first subset is proportional to the respective weight for the shimming coil; and
   distributing the generated electrical currents to the shimming coils in the first subset.

4. The method of claim 1, wherein driving the shimming coils in the first subset of shimming coils comprises simultaneously driving the shimming coils in the first subset of shimming coils.

5. The method of claim 1, wherein driving the shimming coils in the first subset of shimming coils comprises:
   connecting a group of power amplifiers to the first subset of shimming coils, wherein the number of power amplifiers in the group is less than the number of shimming coils in the group of available shimming coils.

6. The method of claim 5, wherein connecting the group of power amplifiers comprises:
   connecting the group of power amplifiers to the first subset of shimming coils such that each power amplifier in the group of power amplifiers is connected to a respective one of the shimming coils in the first subset of shimming coils.

7. The method of claim 5, wherein connecting the group of power amplifiers comprises:
   connecting the group of power amplifiers to the first subset of shimming coils such that each power amplifier in the group of power amplifiers is connected to more than one respective shimming coil.

8. The method of claim 1, wherein:
   driving the first subset of shimming coils comprises connecting a group of power amplifiers to the first subset of shimming coils, wherein the number of power amplifiers in the group is less than the number of shimming coils in the group of available shimming coils; and
   driving the shimming coils of the second subset of shimming coils comprises:
   disconnecting the group of power amplifiers from the first subset of shimming coils; and after disconnecting the group of power amplifiers from the first subset of shimming coils, connecting the group of power amplifiers to the second subset of shimming coils.

9. A magnetic resonance imaging (MM) system, comprising:
a housing having a bore in which a subject to be imaged is placed;
a main magnet accommodated by said housing and configured to generate a substantially uniform magnet field within the bore;
a group of available shimming coils placed around said housing and configured to increase a homogeneity of the magnetic field;
pulse generating coils to generate and apply radio frequency (RF) pulses in sequence to scan the subject;
gradient coils to provide perturbations to the substantially uniform magnet field that encode MM signals acquired in response to the applied RF pulses;
a control unit coupled to the main magnet and configured to:
access data indicating a first region for imaging at least a portion of a subject, the portion being placed in a main magnet of the MM system and the main magnet generating a substantially uniform magnetic field;
based on the accessed data, dynamically selecting, by a control unit associated with the MRI system and from a group of available shimming coils, a first subset of shimming coils for increasing a homogeneity of the magnetic field at the first region; and
driving, using a fixed group of amplifiers, the shimming coils in the selected first subset of shimming coils without driving other shimming coils in the group of available shimming coils such that the homogeneity of the magnetic field at the first region increases relative to the homogeneity of the magnetic field at the first region when the shimming coils of the selected first subset are not driven by the fixed group of amplifiers,
wherein a number of power amplifiers in the fixed group of amplifiers is smaller than a number of shimming coils in the available shimming coils, and
wherein the fixed group amplifier is used even when a different subset of shimming coils are dynamically selected for increasing the homogeneity of the magnetic field at the first region.

10. The MM system of claim 9, wherein the control unit is further configured to:
determine respective weights to be applied to the shimming coils in the first subset of shimming coils.

11. The MM system of claim 10, further comprising:
the group of power amplifiers.

12. The MM system of claim 11, wherein each power amplifier is configured to:
generate an electrical current for each of the shimming coils in the first subset of shimming coils in accordance with the determined respective weight.

13. The MRI system of claim 11, wherein each power amplifier is connected to a respective shimming coil.

14. The MRI system of claim 11, wherein each power amplifier is connected to more than one shimming coils.

15. The MM system of claim 10, wherein each shimming coil is configured to:
apply a field correction to the magnetic field in accordance with a particular order basis function.

16. The MRI system of claim 15, wherein the particular order basis function is a spherical harmonic function.

17. The MRI system of claim 10, wherein the first subset of shimming coils correspond to a group of basis functions and wherein more than one order basis functions are blended according to the respective determined weights.

18. The MRI system of claim 9, wherein the control unit is further configured to:
cause the shimming coils in the first subset of shimming coils to be driven comprises: causing the group of power amplifiers to be connected to the first subset of shimming coils; and
cause the shimming coils in the second subset of shimming coils to be driven comprises:
causing the group of power amplifiers to be disconnected from the first subset of shimming coils; and
after the group of power amplifiers are disconnected from the shimming coils of the first subset, causing the group of power amplifiers to be connected to the second subset of shimming coils.

* * * * *